US012727393B1

(12) United States Patent
Kawa et al.

(10) Patent No.: US 12,727,393 B1
(45) Date of Patent: Sep. 1, 2026

(54) JOSEPHSON JUNCTION STRUCTURES

(71) Applicant: Synopsys, Inc., Sunnyvale, CA (US)

(72) Inventors: Jamil Kawa, Campbell, CA (US); Victor Moroz, Saratoga, CA (US); Stephen Robert Whiteley, Sunnyvale, CA (US)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 18/627,785

(22) Filed: Apr. 5, 2024

Related U.S. Application Data

(63) Continuation of application No. 16/927,468, filed on Jul. 13, 2020, now Pat. No. 12,041,858.

(51) Int. Cl.
*H10N 60/80* (2023.01)
*G01R 33/035* (2006.01)
*G06N 10/00* (2022.01)
*H10N 60/01* (2023.01)
*H10N 60/12* (2023.01)

(52) U.S. Cl.
CPC ....... *H10N 60/805* (2023.02); *G01R 33/0354* (2013.01); *G06N 10/00* (2019.01); *H10N 60/0156* (2023.02); *H10N 60/0912* (2023.02); *H10N 60/12* (2023.02)

(58) Field of Classification Search
CPC ............. H10N 60/805; H10N 60/0156; H10N 60/0912; H10N 60/12; G01R 33/0354; G06N 10/00
USPC .............. 326/3; 307/306; 324/248; 505/861; 257/31
See application file for complete search history.

(56) References Cited

U.S. PATENT DOCUMENTS 5,550,101 A 8/1996 Nagata et al.
11,145,802 B2 10/2021 Lazar et al.
2007/0108437 A1 5/2007 Tavkhelidze
2016/0149111 A1 5/2016 Cybart et al.
2020/0287119 A1 9/2020 Black et al.
2020/0335550 A1 10/2020 Rosenblatt et al.
2021/0151653 A1* 5/2021 Holmes .................. H10N 10/81

* cited by examiner

*Primary Examiner* — Arnold M Kinkead
(74) *Attorney, Agent, or Firm* — Laxman Sahasrabuddhe; Park, Vaughan, Fleming & Dowler LLP

(57) ABSTRACT

Josephson junction (JJ) structures are disclosed. In some embodiments, a JJ structure may include alternating planar superconducting structures and planar non-superconducting structures arranged along a direction away from a wafer surface.

20 Claims, 13 Drawing Sheets

Photoresist 616
Nb 640
Vertical non-superconducting structures 648
Z
Silicon dioxide 650
Silicon wafer 602
X

JOSEPHSON JUNCTION STRUCTURES

RELATED APPLICATION

This application is a continuation of, and claims priority to, U.S. patent application Ser. No. 16/927,468, which was filed on 13 Jul. 2020. The contents of U.S. patent application Ser. No. 16/927,468 are herein incorporated by reference in their entirety for all purposes.

This application is related to U.S. patent application Ser. No. 16/927,474 (which issued as U.S. Pat. No. 11,489,102) and U.S. patent application Ser. No. 16/927,458 (which issued as U.S. Pat. No. 11,342,492).

TECHNICAL FIELD

The present disclosure relates to superconducting devices. More specifically, the present disclosure relates to Josephson junction (JJ) structures.

BACKGROUND

An increasing demand for computing and storage capacity has fueled an increase in the size and complexity of integrated circuit (IC) designs. Single flux quantum (SFQ) technology, which relies on the quantum mechanical quantization of magnetic flux, is a technology that may help meet future computing and storage demands. SFQ technology is based on flux storage and transmission, and uses pulses emitted by JJs.

SUMMARY

Some embodiments described herein may feature a structure that includes alternating planar superconducting structures and planar non-superconducting structures arranged along a direction away from a wafer surface. A first subset of the planar superconducting structures may be electrically coupled to a first terminal, and a second subset of the planar superconducting structures may be electrically coupled to a second terminal, thereby forming a set of JJs that are coupled in parallel between the first terminal and the second terminal. In some embodiments, a first planar superconducting structure may be electrically coupled to a first terminal, and a second planar superconducting structure may be electrically coupled to a second terminal, thereby forming a set of JJs that are coupled in series between the first terminal and the second terminal.

Some embodiments may feature an interdigitated superconducting structure that includes multiple superconducting layers, and a non-superconducting layer disposed between each pair of adjacent superconducting layers. In these embodiments, a first subset of superconducting layers may be electrically coupled to a first terminal, and a second subset of superconducting layers may be electrically coupled to a second terminal, thereby forming a set of JJs that are coupled in parallel between the first terminal and the second terminal.

Some embodiments may feature a structure that includes a stack of multiple multi-layer structures, and each multi-layer structure may include at least one superconducting layer and at least one non-superconducting layer.

In some embodiments, at least one non-superconducting structure or layer may be made of a non-magnetic material that is one or more atomic layers thick. In some embodiments, at least one non-superconducting structure or layer may be made of a magnetic material that is one or more atomic layers thick. In some embodiments, at least one non-superconducting structure or layer may have multiple layers of magnetic and non-magnetic materials. In some embodiments, at least one non-superconducting structure or layer may be made of a superconducting material with defects that prevent superconductivity behavior at low temperatures. In some embodiments, at least one non-superconducting structure or layer may be made of an insulating material. In some embodiments, at least one superconducting structure or layer may be made of niobium, aluminum, or lead. In some embodiments, at least one non-superconducting structure or layer may be made of silver, copper, gold, or aluminum oxide.

BRIEF DESCRIPTION OF THE FIGURES

The disclosure may be understood based on the detailed description given below and the accompanying figures. The figures are for illustrative purposes, and do not limit the scope of the disclosure. Furthermore, the figures are not necessarily drawn to scale.

DETAILED DESCRIPTION

Figure 1A:
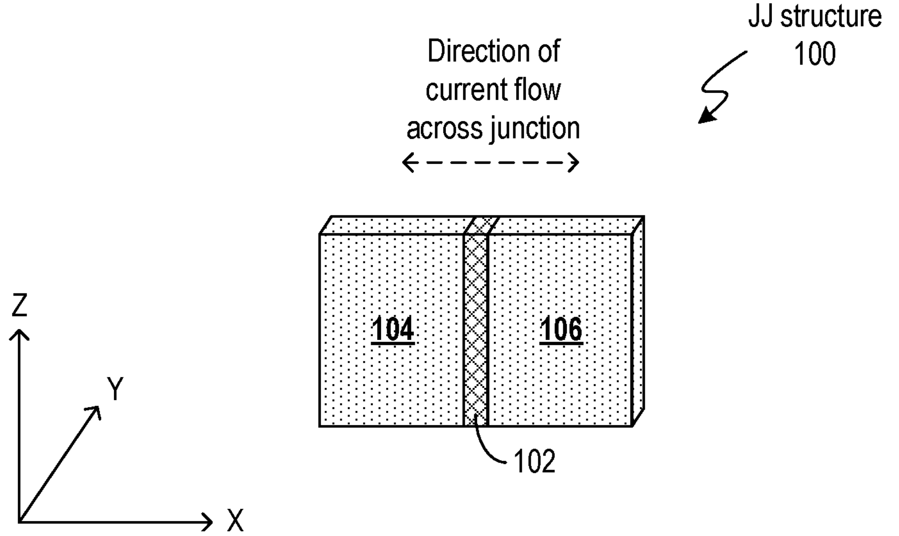
FIGS. 1A-1B illustrate a JJ structure in accordance with some embodiments described herein.

Aspects disclosed herein relate to JJ structures and processes for creating JJ structures. Moving to smaller technology nodes may cause the critical current of a JJ to fall below an acceptable threshold. Embodiments described herein may extend a JJ structure in a direction away from the silicon wafer surface (e.g., along the vertical direction) to compensate for the reduction in the feature size, which may allow the JJ structure to have a critical current that is greater than a desired value, even at smaller technology nodes. In this manner, embodiments disclosed herein may enable SFQ technology to continue to support future computing and storage needs by progressively moving to smaller technology nodes.

When a JJ emits a voltage pulse, it may induce a single quantum of magnetic flux into a superconducting inductor that is electrically connected to the JJ. Some SFQ devices may achieve pulse widths close to a picosecond. In SFQ technology, logic states may be transmitted between logic gates by propagating SFQ pulses, which may be generated by JJs.

In some embodiments, a JJ includes two superconducting structures separated by a non-superconducting structure. In this disclosure, the non-superconducting structure that separates two superconducting structures may be referred to as a junction. In a JJ, the junction may support a current that may flow indefinitely without any voltage applied.

The bias current of a JJ may be set to a level that is less than the critical current $I_c$, and larger than the critical current $I_c$ minus the minimum input pulse amplitude that is desired to trigger the JJ. This range of current values (i.e., less than $I_c$, and greater than $I_c$ minus the minimum input pulse amplitude that is desired to trigger the JJ) may be substantially smaller than the critical current $I_c$.

The critical current of a JJ depends on the current density across the junction and the cross-sectional area of the junction, where the cross-section plane is perpendicular to the direction of current flow through the junction. For SFQ technology to meet future computing and storage demands, SFQ technology may need to move to progressively smaller technology nodes. Reducing the feature size of a JJ may reduce the cross-sectional area of the junction, which, in turn, may reduce the critical current. Reducing the critical current may be a problem because it is generally desirable to keep the critical current large enough to allow a sufficiently large noise margin.

Embodiments described herein feature a JJ structure that is capable of supporting substantially the same critical current while reducing the feature size of the JJ. Advantages of embodiments disclosed herein include, but are not limited to, enabling feature sizes of JJs used in SFQ circuits to be decreased while ensuring that the critical current of the JJs remains greater than a desired threshold, which allows the noise margin of the JJs to be greater than a desired threshold.

As mentioned above, a JJ includes two superconducting structures separated by a non-superconducting structure. The non-superconducting structure may be made of one or more atomic layers of a magnetic or non-magnetic material, or may have multiple layers of magnetic and non-magnetic materials. Although examples of JJ structures described below are illustrated in the context of specific materials, the embodiments disclosed herein are not limited to using those materials.

By way of non-limiting examples, a superconducting structure may be made of aluminum (Al), niobium (Nb), lead (Pb), or any other superconducting material. In some embodiments, a non-superconducting structure may be a thin insulating tunnel barrier that is made of aluminum/aluminum oxide (Al/$AlO_x$). In other embodiments, a non-superconducting structure may be made of a conducting material, such as silver (Ag), copper (Cu), or gold (Au), that does not exhibit superconductivity at low temperatures. In yet other embodiments, a non-superconducting structure may be a multilayered structure that may include one or more magnetic, non-magnetic, insulating, conducting, or ferromagnetic layers. In some embodiments, the non-superconducting structure is made of a superconducting material that has defects (which may have been introduced into the superconducting material by using a suitable technique, e.g., an electron beam), which prevent superconductivity at low temperatures.

Without loss of generality, in this disclosure, the wafer surface is assumed to be parallel to the XY plane, the length of a structure along the X direction is referred to as the length of the structure, the length of the structure along the Y direction is referred to as the width of the structure, and the length of the structure along the Z direction is referred to as the height or thickness/thinness of the structure.

In the figures, different fill patterns are used to depict different types of materials. Specifically, lightly shaded areas depict superconducting materials (e.g., superconducting structure 104 in FIG. 1A below), and crosshatched areas depict non-superconducting materials (e.g., non-superconducting structure 102 in FIG. 1A below). Other fill patterns that depict other materials are described below, and are consistently used throughout the figures.

Figure 1B:
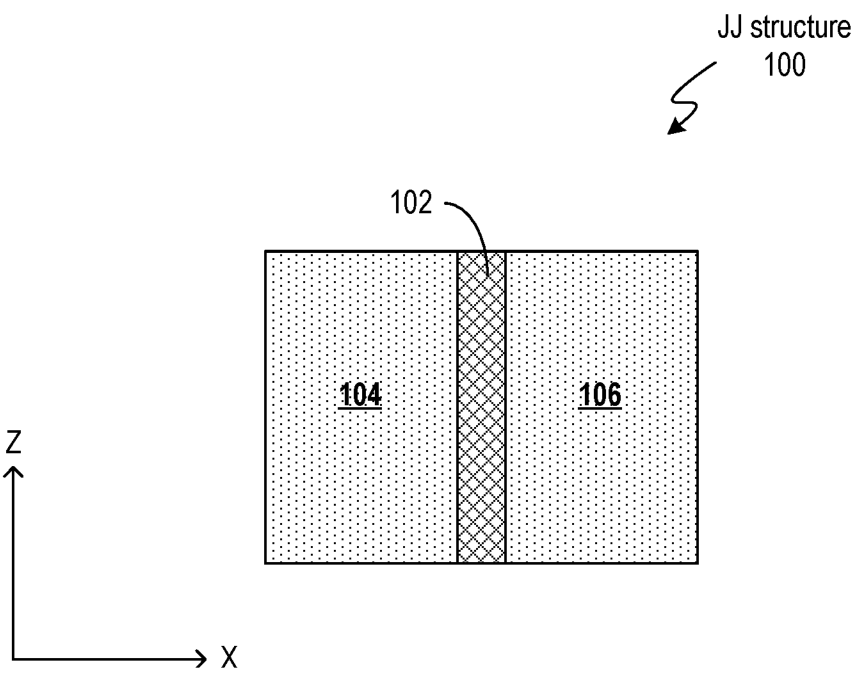

FIGS. 1A-1B illustrate a JJ structure in accordance with some embodiments described herein. The three-dimensional view of JJ structure 100 shown in FIG. 1A includes non-superconducting structure 102 sandwiched between superconducting structures 104 and 106. FIG. 1B illustrates a cross-sectional view of JJ structure 100, where the cross-section is taken along the XZ plane.

The critical current of JJ structure 100 depends on the current density and the cross-sectional area of the junction across the YZ plane (i.e., the area of the YZ surface of the junction). When manufacturing moves to a smaller technology node, the width of JJ structure 100 may become smaller. Embodiments described herein allow the height of JJ structure 100 to be increased, which may cause the YZ cross-sectional area of the junction to remain above a desired value, which, in turn, may cause the critical current of JJ structure 100 to remain above a desired value.

Note that the direction of current flow in FIGS. 1A-1B is along the X direction. In other words, the direction of the current flow is parallel to the XY plane, i.e., parallel to the silicon wafer surface.

Specifically, in some embodiments, the JJ structure includes a first superconducting structure and a second superconducting structure disposed on a plane parallel to a silicon wafer surface. A non-superconducting structure may be disposed between the first superconducting structure and the second superconducting structure, where a direction of current flow through the non-superconducting structure is parallel to the silicon wafer surface. The non-superconducting structure may have a first length along a first direction that is parallel to the direction of current flow through the non-superconducting structure, a second length along a second direction that is parallel to the silicon wafer surface, and a third length along a third direction that is directed away (e.g., perpendicular) from the silicon wafer surface. The third length may be greater than the second length.

Figure 2A:
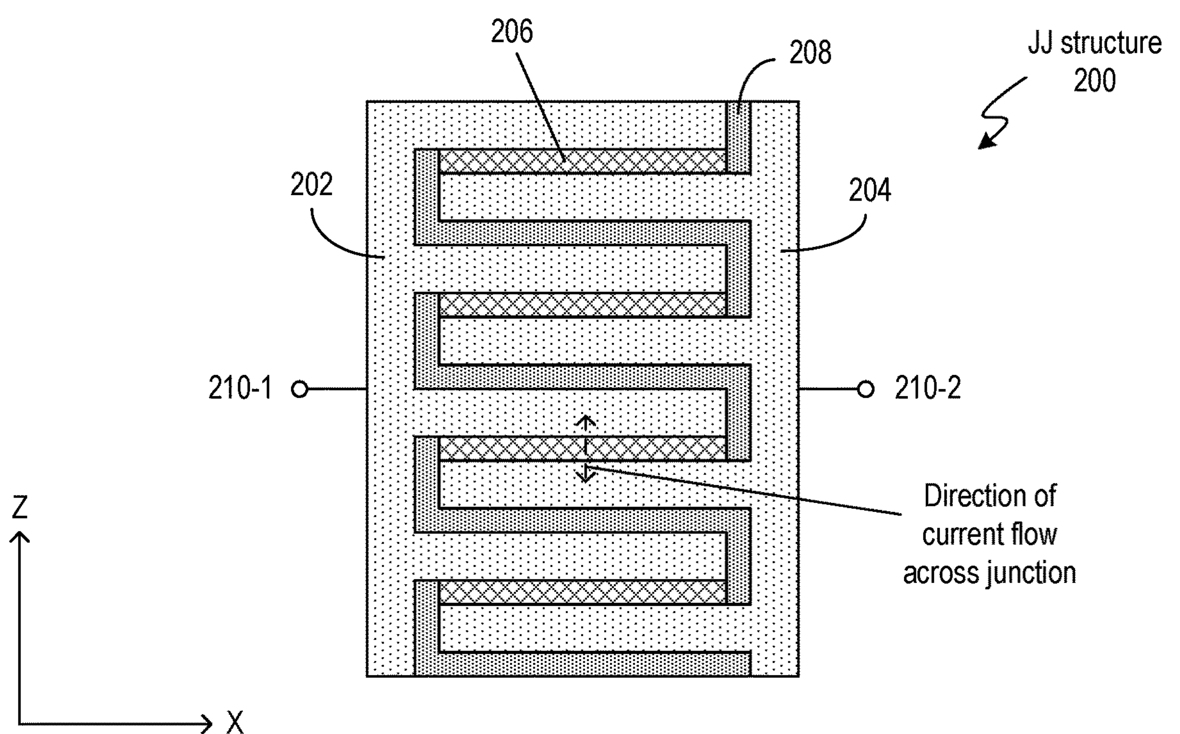
FIGS. 2A-2C illustrate JJ structures in accordance with some embodiments described herein.
Figure 2B:
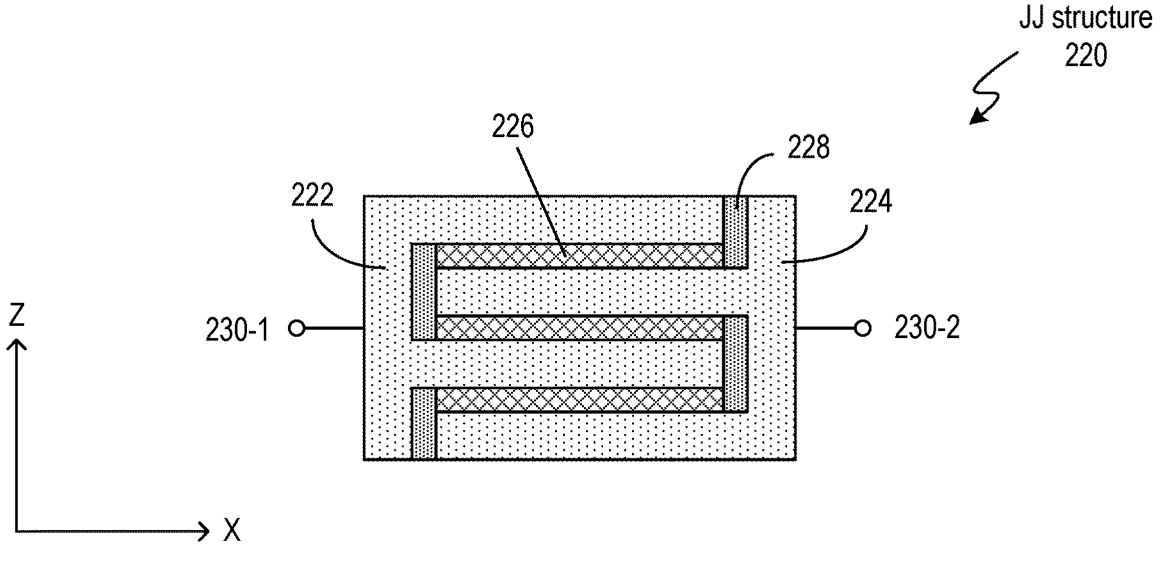
Figure 2C:
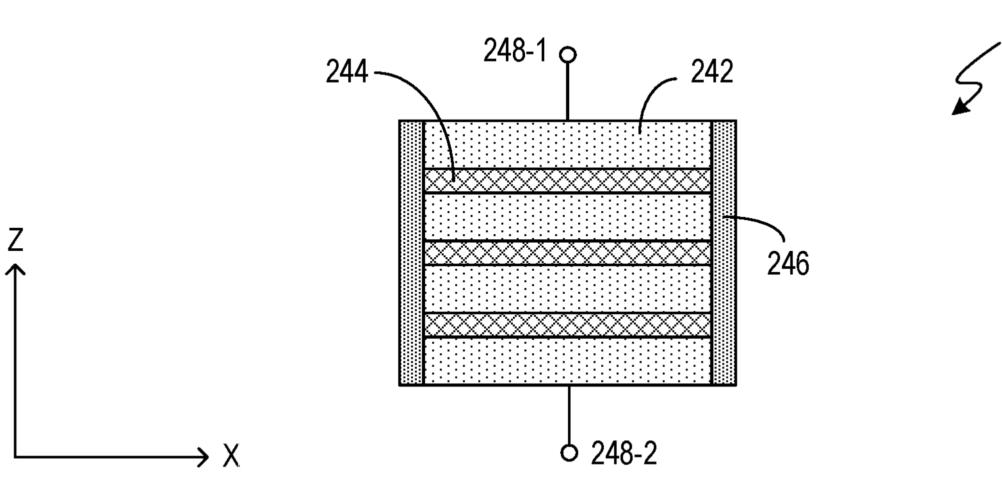

FIGS. 2A-2C illustrate JJ structures in accordance with some embodiments described herein. In some embodiments, the JJ structure may include alternating planar superconducting structures and planar non-superconducting structures arranged or stacked along a direction away from the wafer surface (e.g., perpendicular to a wafer surface). For example, in FIG. 2A, JJ structure 200 includes interdigitated superconducting structures 202 and 204 separated by non-superconducting structures, such as non-superconducting structure 206. As shown in FIG. 2A, insulator (e.g., silicon dioxide) 208 may also be used in JJ structure 200 to separate interdigitated superconducting structures 202 and 204. The terminals of JJ structure 200 are shown in FIG. 2A as 210-1 and 210-2.

In FIG. 2B, JJ structure 220 includes interdigitated superconducting structures 222 and 224 separated by non-superconducting structure 226. Insulator 228 may also be used in JJ structure 220 to separate interdigitated superconducting structures 222 and 224. The terminals of JJ structure 200 are shown in FIG. 2A as 230-1 and 230-2. As shown in FIG. 2B, a first subset of planar superconducting structures 222 is electrically coupled to a first terminal 230-1, and a second subset of planar superconducting structures 224 is electrically coupled to a second terminal 230-2, thereby forming a set of Josephson junctions that are coupled in parallel between the first terminal and the second terminal.

The total cross-sectional area of the junction in JJ structure 200 (or 220) is equal to the sum of the individual cross-sectional areas of each junction. For example, in FIG. 2A, the total cross-sectional area of the junction may be equal to four times the cross-sectional area (the cross-section plane is parallel to the XY plane) of non-superconducting structure 206 because there are four junctions in JJ 200 that are coupled in parallel. Note that the direction of current flow in FIGS. 2A and 2B is in the Z direction, and the junction is parallel to the XY plane.

In FIG. 2C, JJ structure 240 includes multiple layers of superconducting structures (e.g., superconducting structure 242) that are separated by non-superconducting structures (e.g., non-superconducting structure 244). Insulating layer 246 may also be used in JJ structure 240. The terminals of JJ structure 240 are shown in FIG. 2C as 248-1 and 248-2. JJ structure 240 may be viewed as a series of JJs, and may be used in applications in which multiple JJs coupled in series are desired. Specifically, in the structure shown in FIG. 2C, a first planar superconducting structure may be electrically coupled to a first terminal, and a second planar superconducting structure may be electrically coupled to a second terminal, thereby forming a set of Josephson junctions that are coupled in series between the first terminal and the second terminal. A set of JJs that are coupled in series (e.g., the structure shown in FIG. 2C) may be used to construct current-to-phase transducers, which may replace inductors in JJ circuits.

Figure 3A:
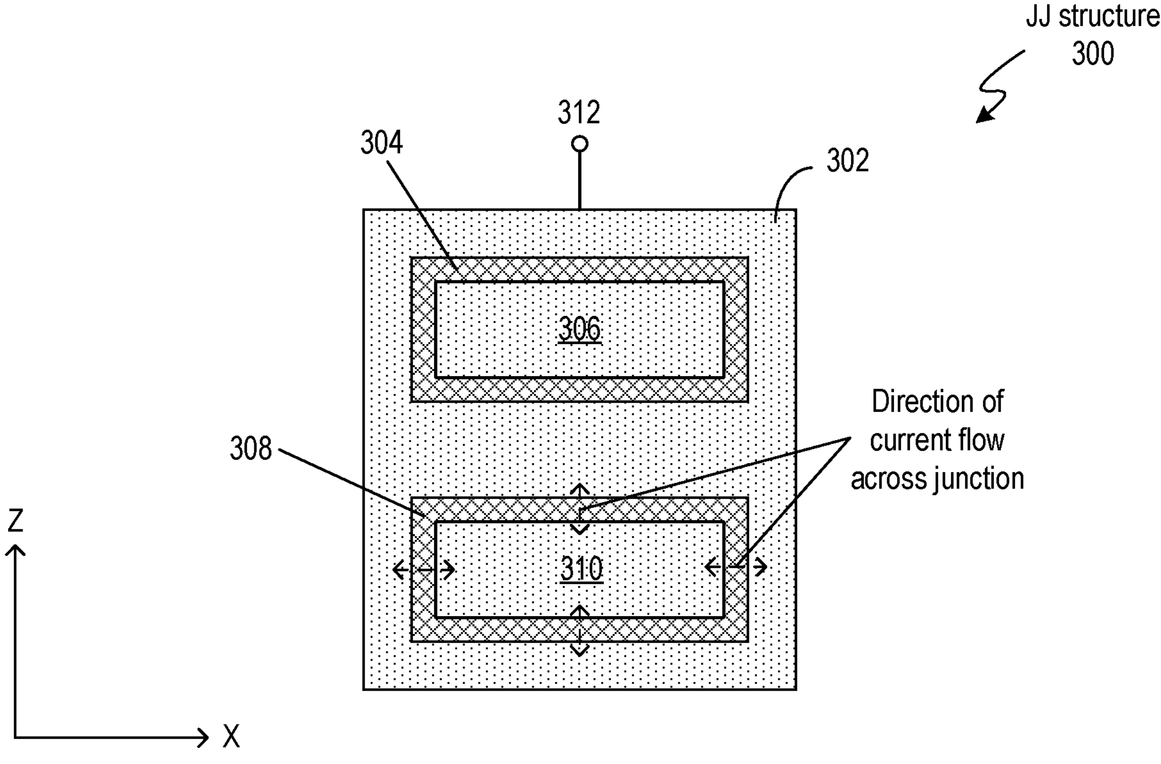
FIGS. 3A-3B illustrate JJ structures in accordance with some embodiments described herein.
Figure 3B:
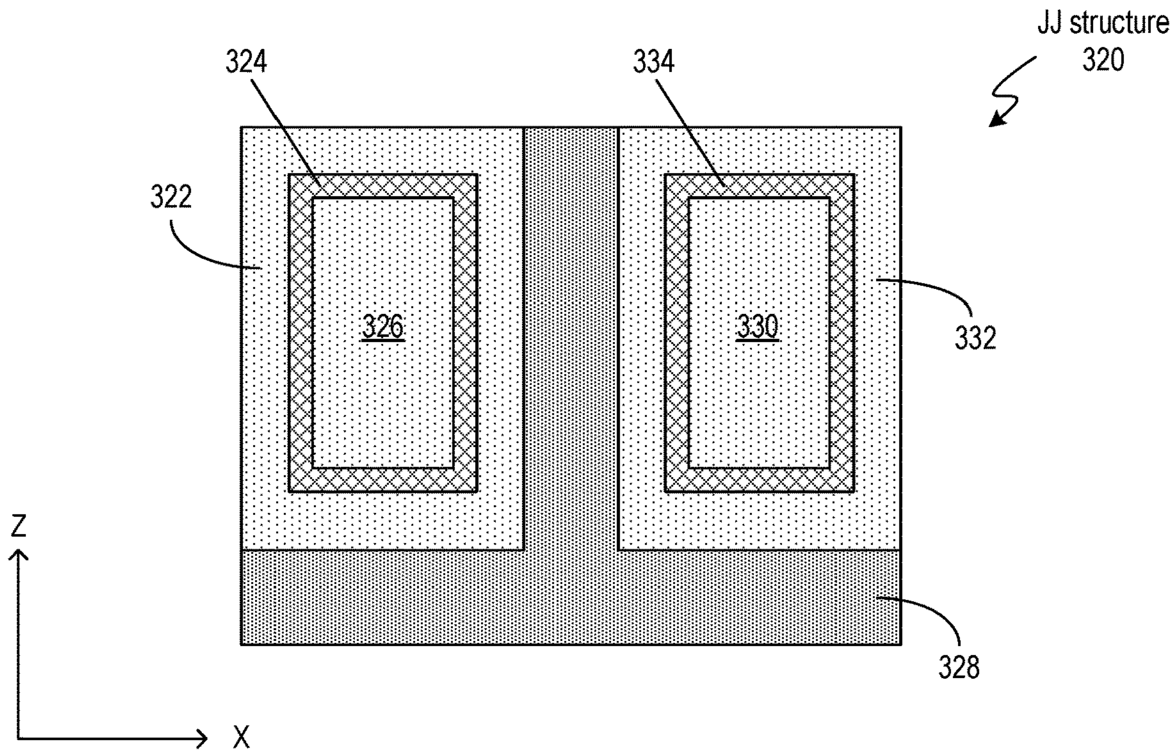

FIGS. 3A-3B illustrate JJ structures in accordance with some embodiments described herein. In FIG. 3A, JJ structure 300 includes non-superconducting structures 304 and 308, each having a hollow region, with superconducting structures inside the hollow region (e.g., superconducting structure 306 inside the hollow region of non-superconducting structure 304, and superconducting structure 310 inside the non-superconducting structure 308), and all around outside (e.g., superconducting structure 302 that is all around outside non-superconducting structures 304 and 308). In other words, JJ structure 300 may include a non-superconducting structure having a hollow region (e.g., a hollow rectangular shape) with superconducting material present both inside and outside the hollow region. One terminal (e.g., terminal 312) of JJ structure 300 may be electrically coupled to superconducting structure 302, and the other terminal (not shown in FIG. 3A) may be electrically coupled to superconducting structures 306 and 310. Current may flow across the junction as shown in FIG. 3A. The cross-sectional area of the junction in JJ structure 300 may depend on the sum of the perimeters of the hollow shapes formed by the non-superconducting structures.

In FIG. 3B, JJ structure 320 includes two JJ devices separated by insulating structure 328. A first device may include non-superconducting structure 324 that forms a shape with a hollow region. Superconducting structure 326 is disposed inside the hollow region, and superconducting structure 322 is disposed outside non-superconducting structure 324. A second device may include non-superconducting structure 334 that forms a shape with a hollow region. Superconducting structure 330 is disposed inside the hollow region, and superconducting structure 332 is disposed outside non-superconducting structure 334. The two JJ devices may be operated separately, or may be coupled in parallel to form a single JJ device.

Figure 4A:
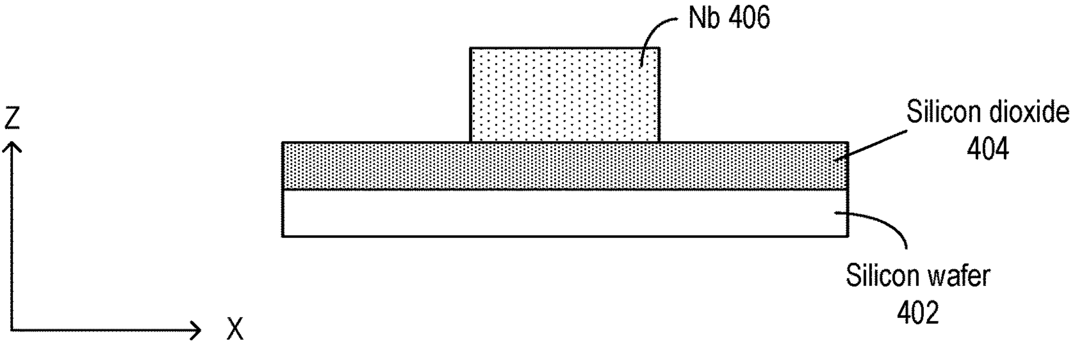
FIGS. 4A-4C illustrate a process for creating a structure in accordance with some embodiments described herein.
Figure 4B:
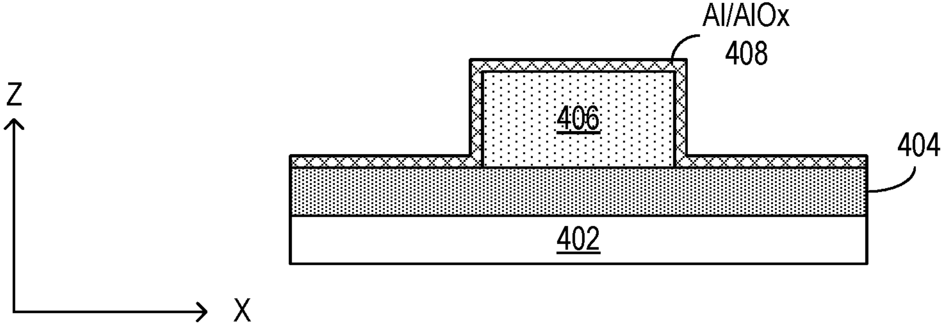
Figure 4C:
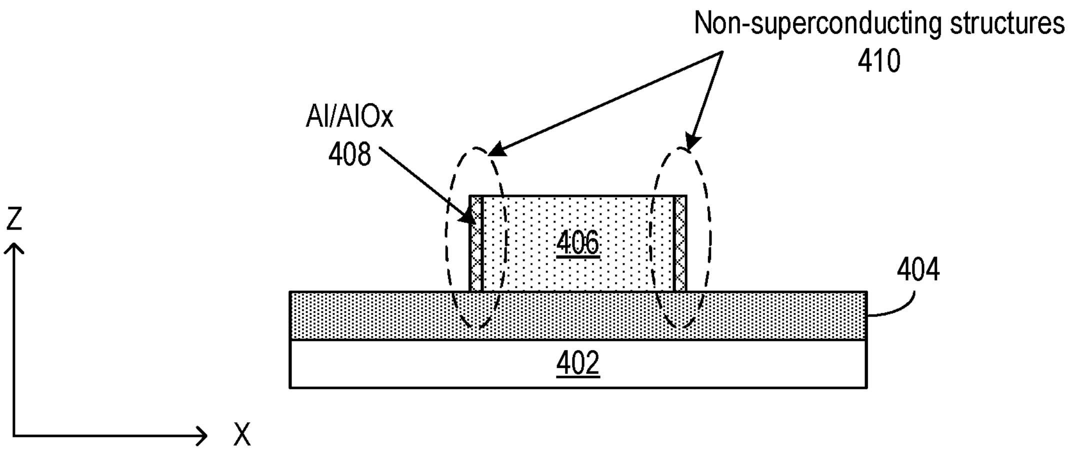

FIGS. 4A-4C illustrate a process for creating a structure in accordance with some embodiments described herein. In FIG. 4A, Nb layer 406 (which is the superconducting material in this example) is disposed on silicon dioxide layer 404, which is disposed on silicon wafer 402. Next, as shown in FIG. 4B, a thin conformal layer of Al/$AlO_x$ (which is the non-superconducting material in this example) is deposited. The process may then perform an anisotropic etch to create non-superconducting structures 410.

Figure 5A:
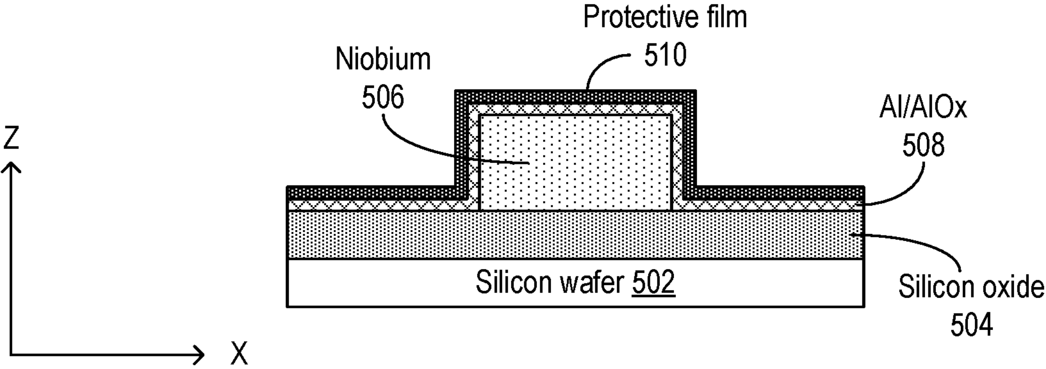
FIGS. 5A-5D illustrate a process for creating a structure in accordance with some embodiments described herein.

FIGS. 5A-5D illustrate a process for creating a structure in accordance with some embodiments described herein. In FIG. 5A, Nb layer 506 (which is the superconducting material in this example) is disposed on silicon dioxide layer 504, which is disposed on silicon wafer 502. Next, a thin, conformal Al/$AlO_x$ layer 508 (which is the non-superconducting material in this example) is deposited. A protective film 510 is then deposited on Al/$AlO_x$ layer 508. Protective film 510 may be made of a material that does not contaminate Nb and Al/$AlO_x$, and exhibits etch selectivity with respect to Al/$AlO_x$ and silicon dioxide. In some embodiments, protective film 510 may be made of silicon nitride ($Si_3N_4$) or amorphous carbon.

Figure 5B:
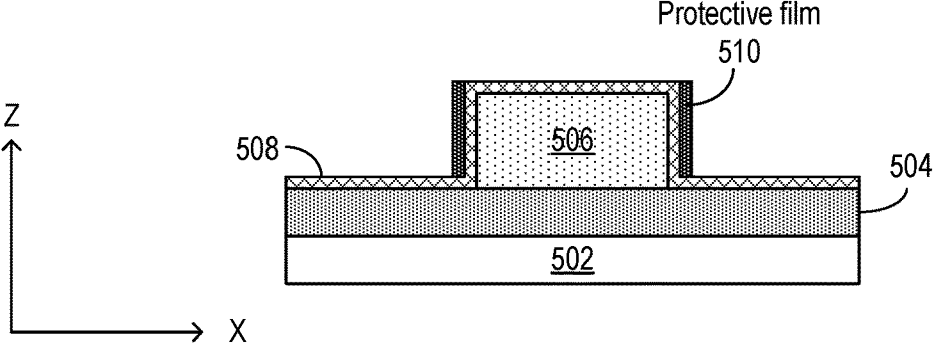
Figure 5C:
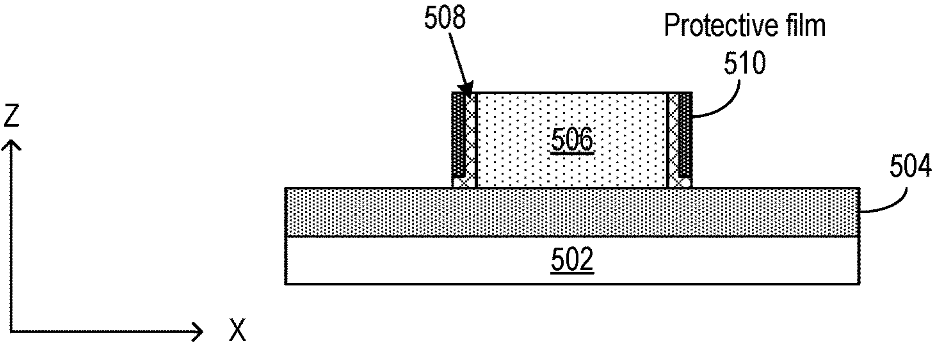
Figure 5D:
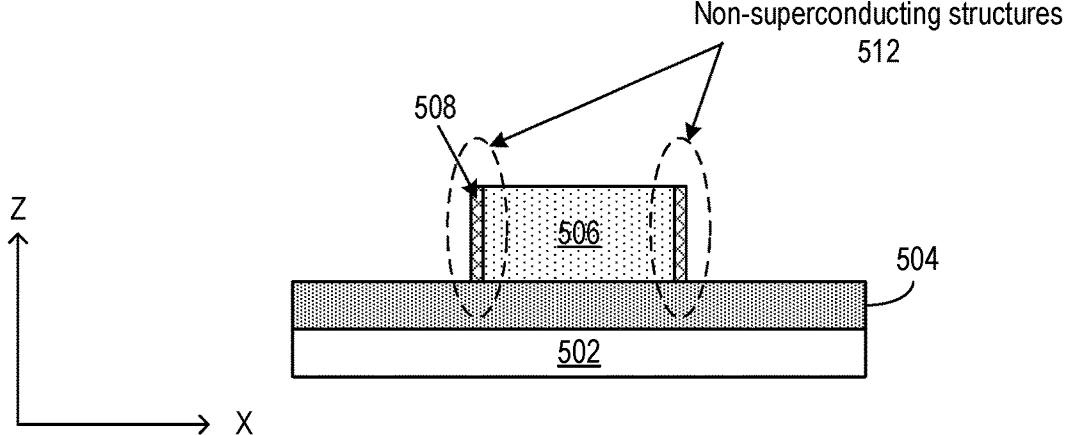

The process may then perform an anisotropic etch of the protective film to create the structure shown in FIG. 5B. Note that the vertical portions of the protective film are intact, while the horizontal portions have been etched away. Next, as shown in FIG. 5C, the process may perform an anisotropic etch to remove horizontal portions of Al/$AlO_x$ layer 508, and perform a selective wet etch to remove the protective film to arrive at the structure shown in FIG. 5D, which includes the desired non-superconducting structures 512. Protective film 510 may protect the vertical portions of Al/$AlO_x$ layer 508 during an anisotropic plasma etch (which may occur between FIGS. 5B and 5C) that removes the horizontal portions of Al/$AlO_x$ layer 508.

Figures 6A, 6B, 6C, 6D:
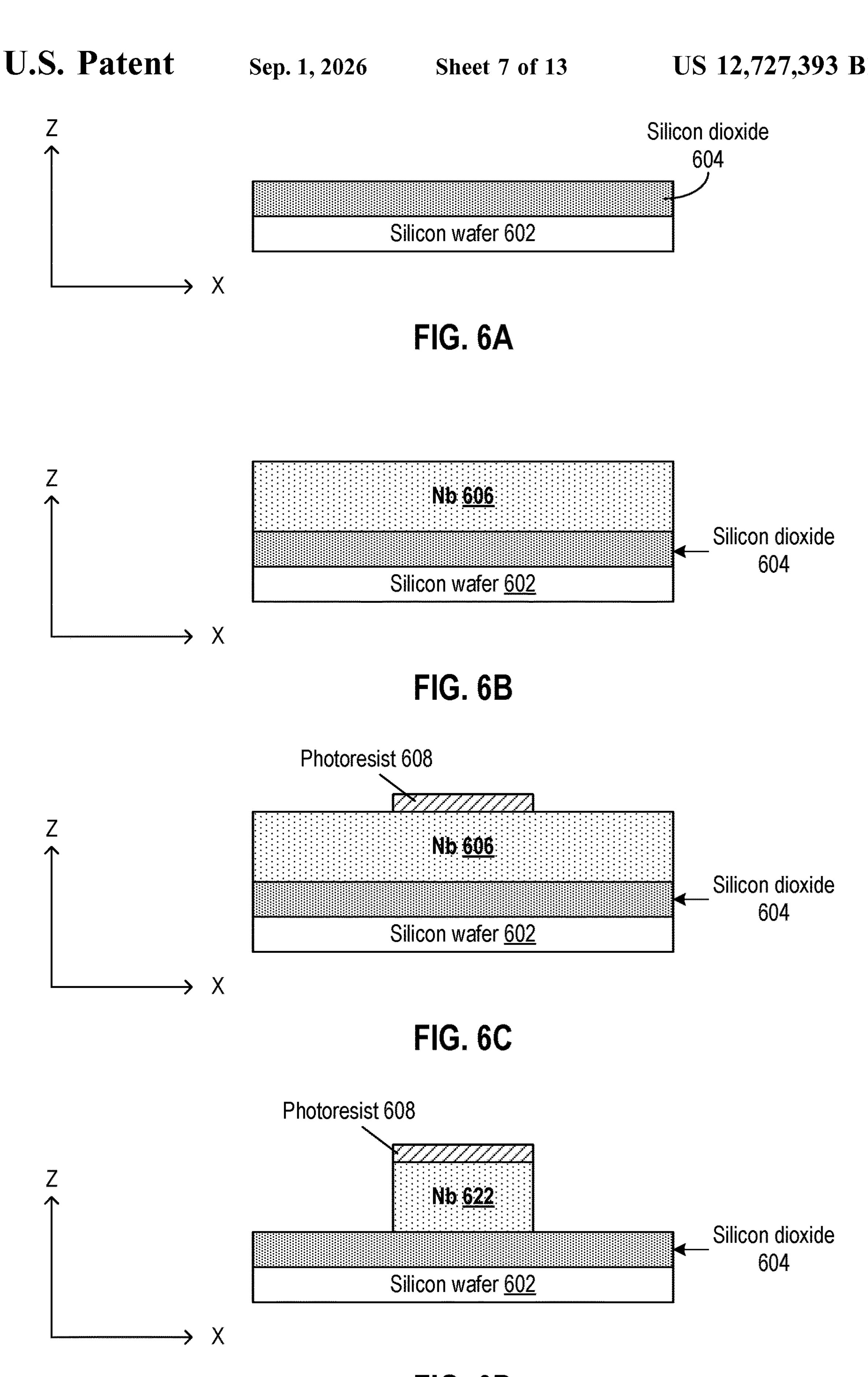
FIGS. 6A-6T illustrate a process for creating a JJ device in accordance with some embodiments described herein.
Figure 6E:
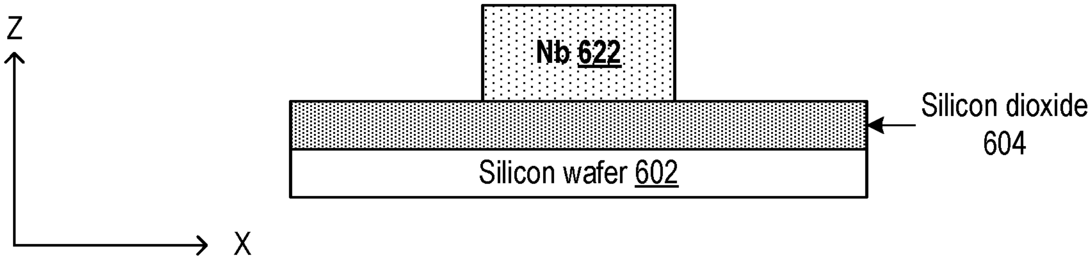
Figure 6F:
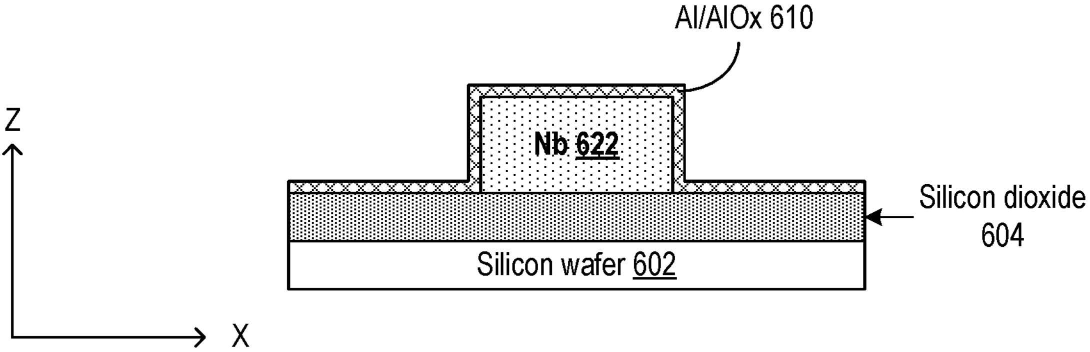
Figure 6G:
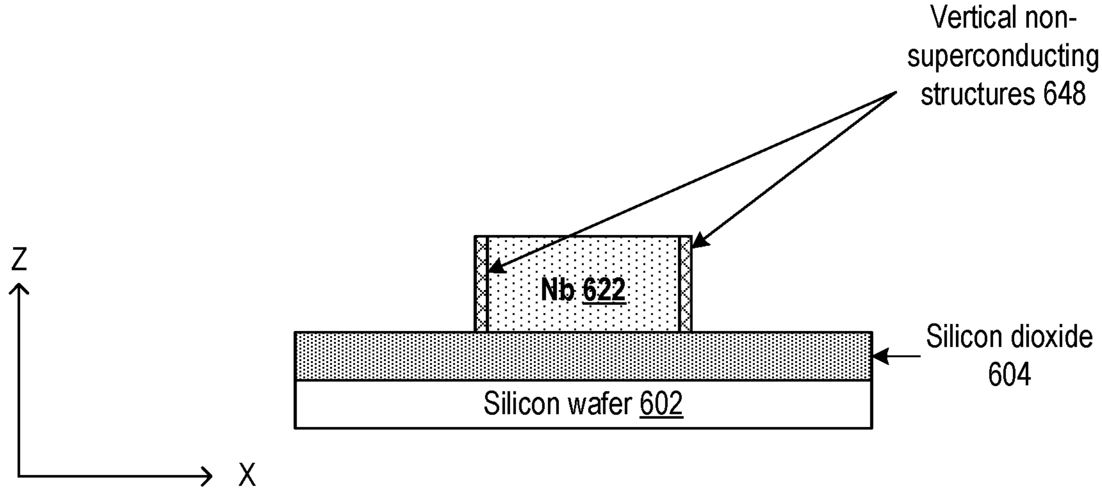
Figure 6H:
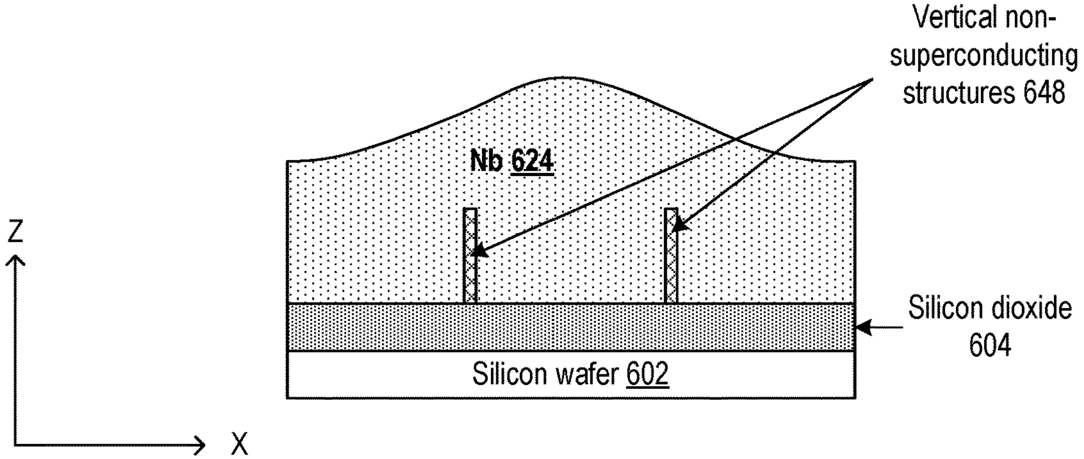
Figure 6I:
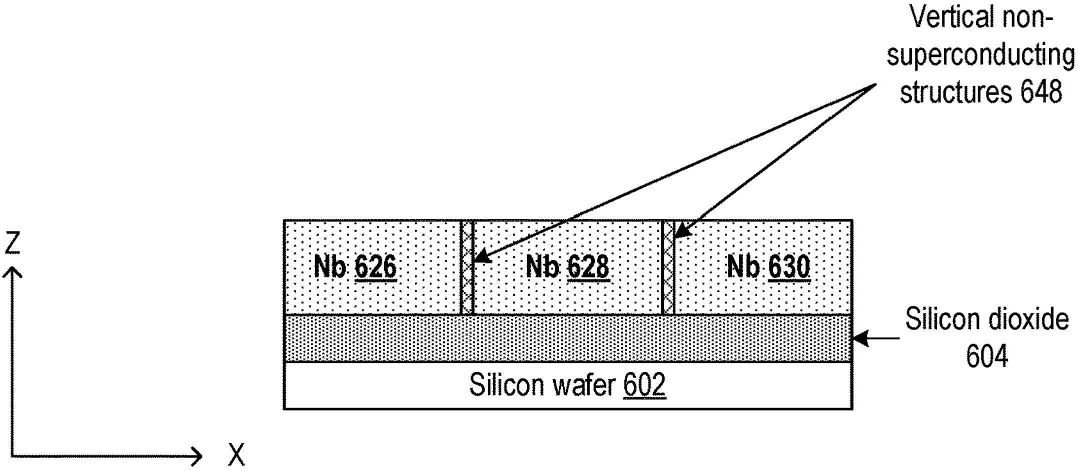
Figure 6J:
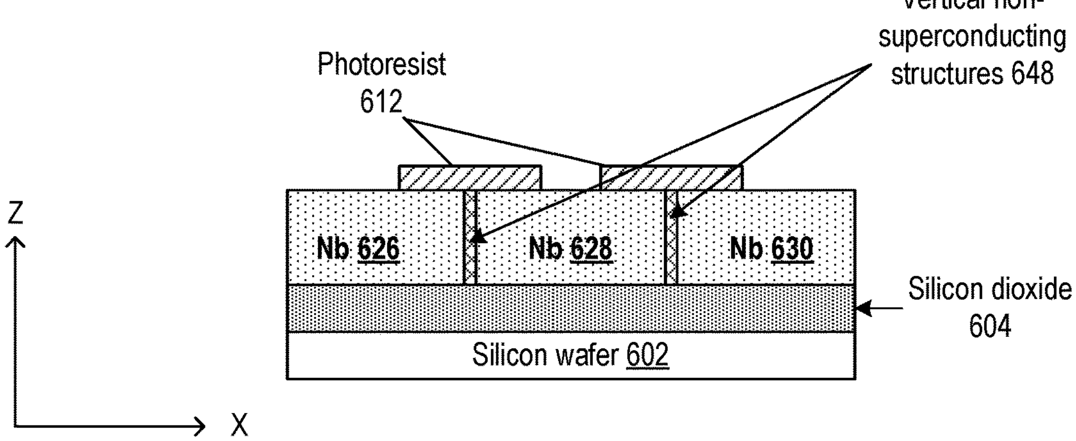
Figure 6K:
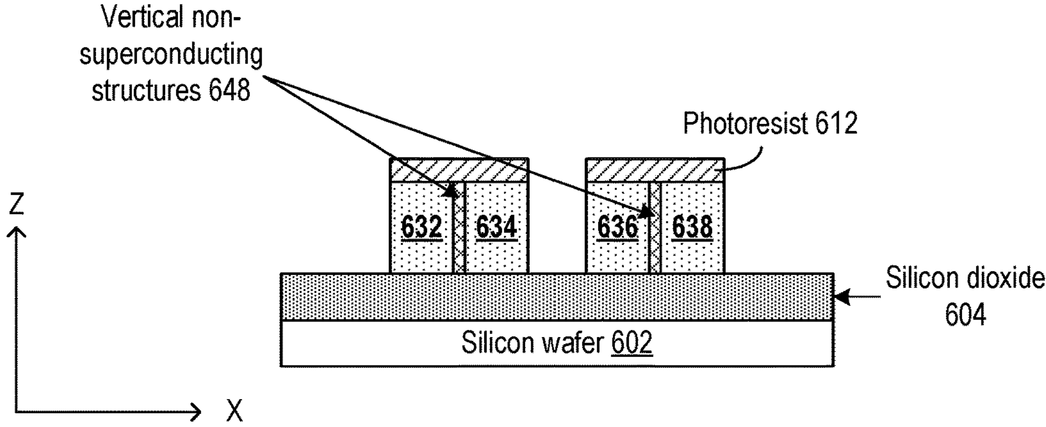
Figure 6L:
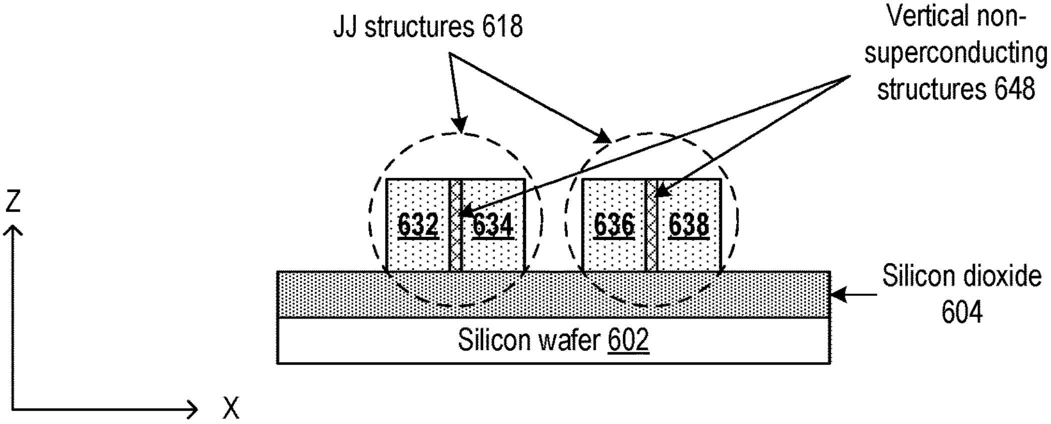
Figure 6M:
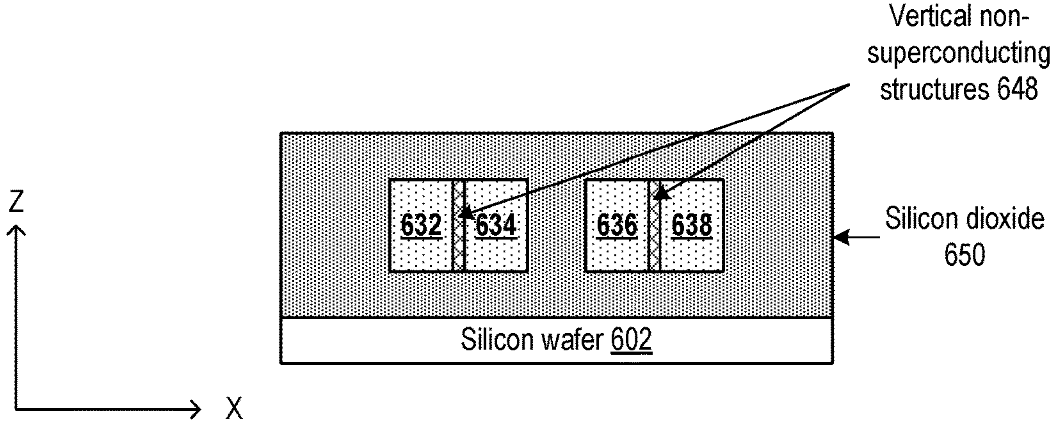
Figure 6N:
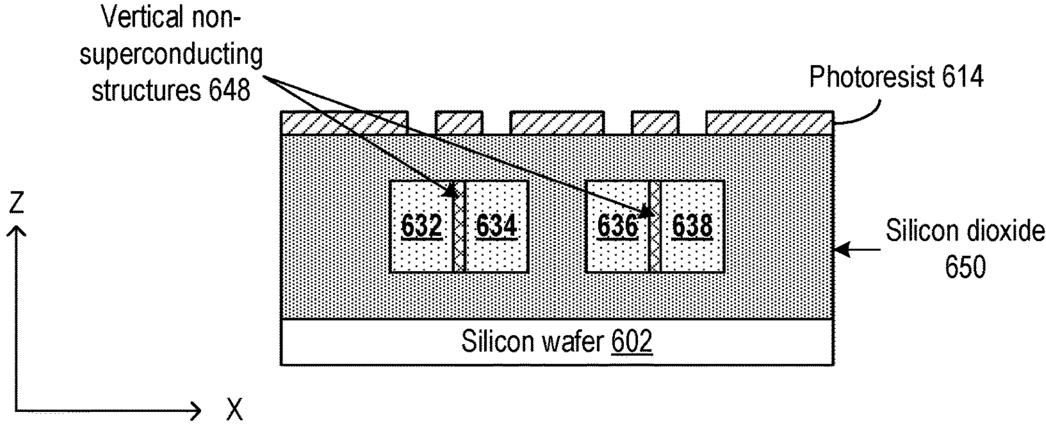
Figure 6O:
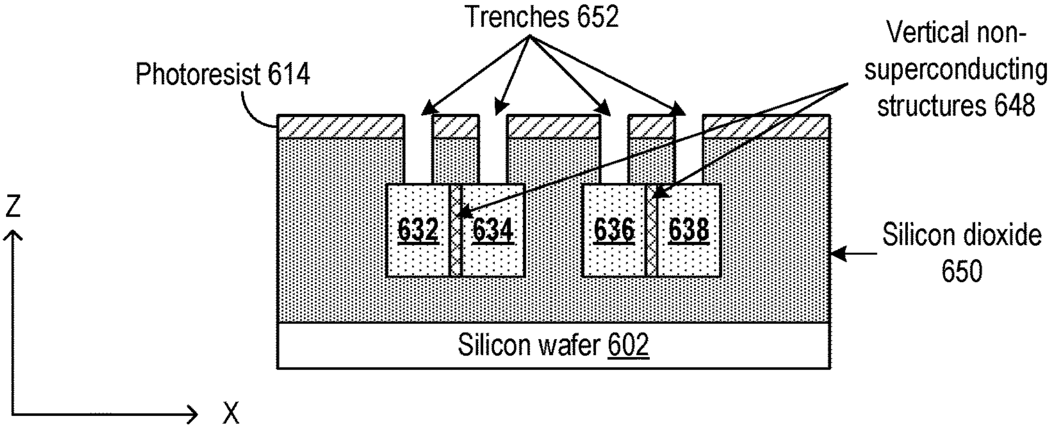
Figure 6P:
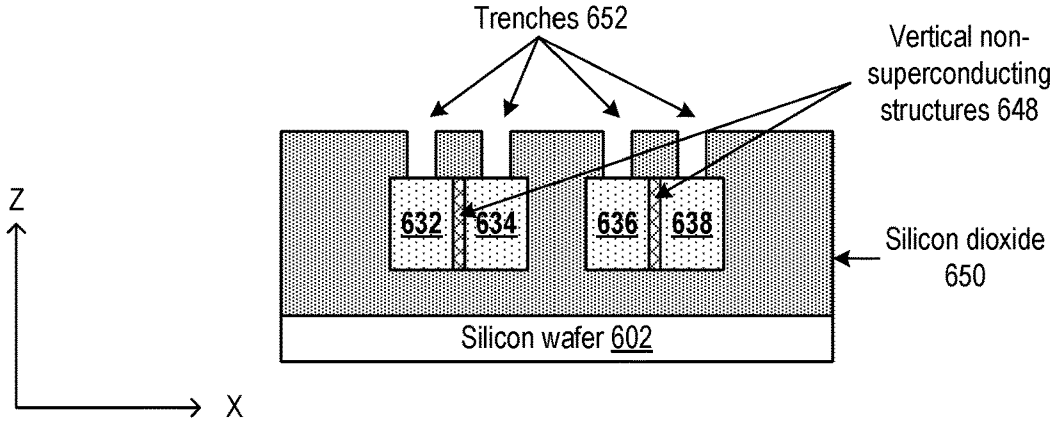
Figures 6Q, 6R:
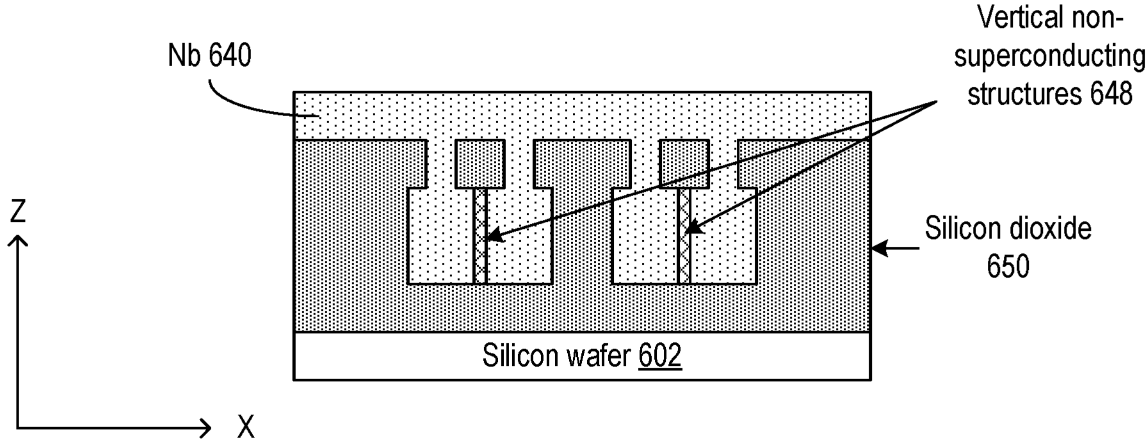
Figure 6S:
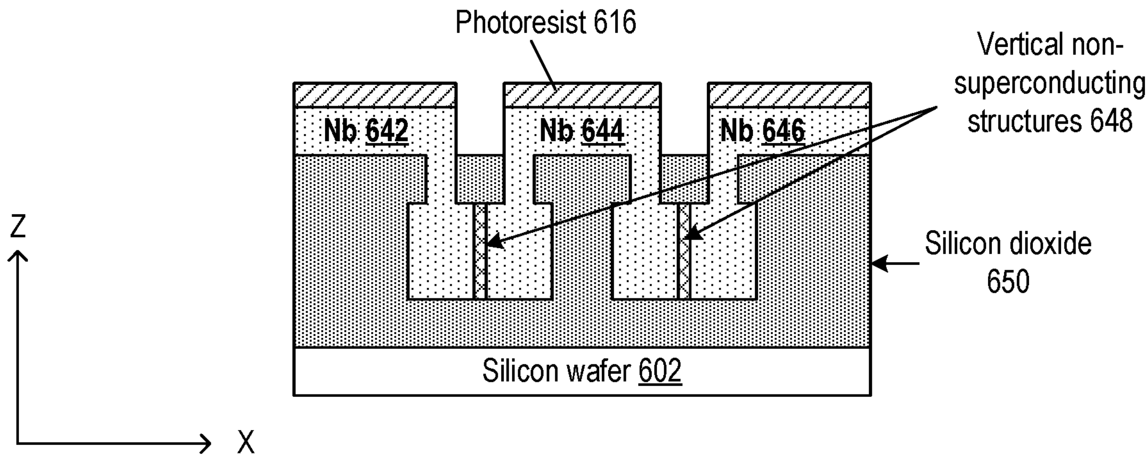
Figure 6T:
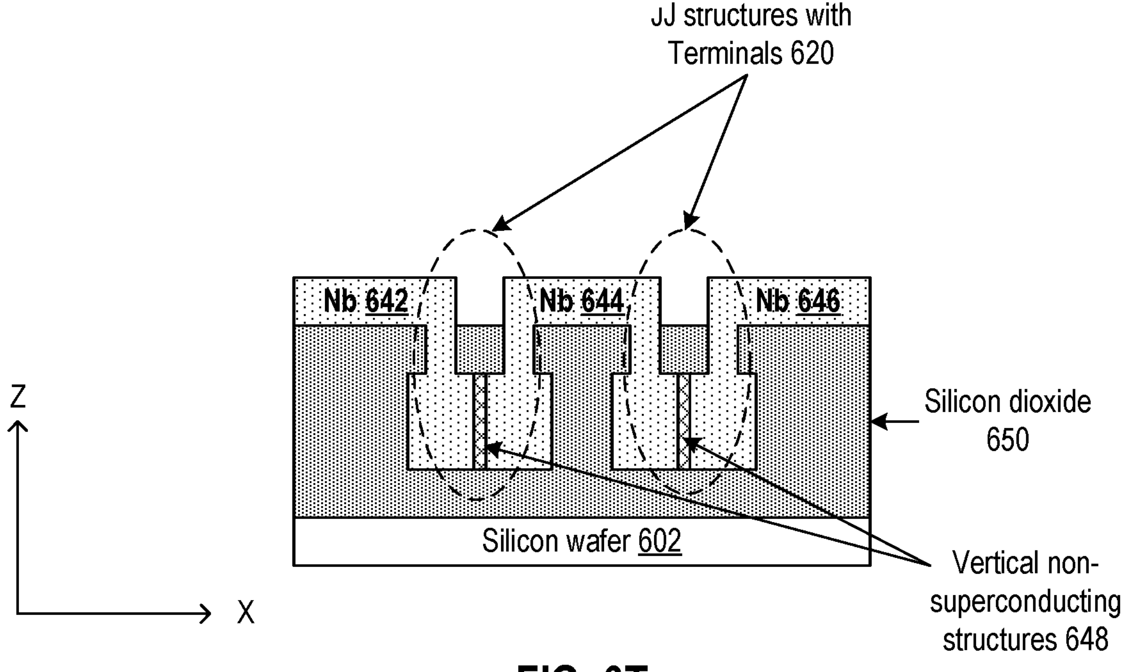

FIGS. 6A-6T illustrate a process for creating a JJ device in accordance with some embodiments described herein. The process may begin by depositing silicon dioxide 604 on a silicon wafer 602 (FIG. 6A). Next, as shown in FIG. 6B, a Nb layer 606 is deposited (which is the superconducting material in this example). The process may then use lithography to create a photoresist pattern 608 (FIG. 6C), and etch the exposed Nb layer 606 to create a superconducting structure 622 (FIG. 6D). The photoresist 608 is removed (FIG. 6E), and a thin conformal layer of Al/$AlO_x$ 610 is deposited (FIG. 6F). Next, anisotropic etch may be performed to create vertical non-superconducting structures 648, i.e., the Al/$AlO_x$ spacers shown in FIG. 6G. Nb 624 is deposited (FIG. 6H), and chemical mechanical polishing may be performed to create a structure that has alternating regions of Nb (626, 628, and 630) and vertical non-superconducting structures 648 (which are made of Al/$AlO_x$ in this example), as shown in FIG. 6I.

Next, a photoresist pattern 612 is created (FIG. 6J), the exposed Nb layer is etched (FIG. 6K) to create Nb structures 632, 634, 636, and 638, and the photoresist is removed to create two JJ structures 618 (FIG. 6L). Silicon dioxide 650 is deposited (FIG. 6M), a photoresist pattern 614 is formed (FIG. 6N), the exposed silicon dioxide is etched (FIG. 6O) to create trenches for connecting terminals to the JJ junctions, and the photoresist is removed (FIG. 6P). Finally, Nb 640 is deposited (FIG. 6Q), a photoresist pattern 616 is formed (FIG. 6R), the exposed Nb is etched (FIG. 6S) to create Nb structures 642, 644, and 646, and the photoresist is removed to create JJ structures with terminals 620, as shown in FIG. 6T.

Some embodiments feature a process for creating a JJ device (as shown in FIGS. 4A-4C, 5A-5D, and 6A-6T). In general, the process may use spacer lithography and atomic layer lithography (which may include atomic layer deposition and atomic layer etch) to create the structures illustrated in FIGS. 1A-1B, 2A-2C, 3A-3B, 4A-4C, 5A-5D, and 6A-6T. In particular, spacer lithography may be used to create vertical structures, e.g., vertical non-superconducting structures illustrated in FIGS. 1A-1B and 3A-3B, and vertical dielectric (e.g., silicon dioxide) structures illustrated in FIGS. 2A-2C.

The process may include (e.g., as shown in FIGS. 4A-4C and 6A-6T) steps of: creating a superconducting structure on a horizontal substrate (the term "substrate" may generally refer to any material on which structures may be created; for example, the term "substrate" may refer to a silicon wafer or a layer of silicon dioxide deposited on a silicon wafer), where the superconducting structure may have at least one horizontal surface and at least one vertical surface; depositing a conformal layer of a non-superconducting material on the at least one horizontal surface and the at least one vertical surface of the superconducting structure; and anisotropically etching the non-superconducting material so that the non-superconducting material is removed on the horizontal surface, but is retained on the vertical surface.

In some embodiments (e.g., as shown in FIGS. 5A-5D), the process may deposit a conformal layer of protective film after depositing the conformal layer of a non-superconducting material on the at least one horizontal surface and the at least one vertical surface of the superconducting structure. Next, the process may perform an anisotropic etch of the protective film so that the protective film is removed on the horizontal surface, but is retained on the vertical surface. The process may then anisotropically etch the non-superconducting material so that the non-superconducting material is removed on the horizontal surface, but is retained on the vertical surface (the protective layer further protects the non-superconducting material on the vertical surface). Next, the process may perform a selective wet etch to remove the protective film to create the desired structure.

In the foregoing disclosure, implementations of the disclosure have been described with reference to specific example implementations thereof. It will be evident that various modifications may be made thereto without departing from the broader scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A superconducting device, comprising:

a wafer surface, wherein the wafer surface is parallel to a first direction and a second direction;

a sequence of Josephson junctions coupled in series and arranged in a third direction which is directed away from the wafer surface, wherein the sequence of Josephson junctions comprises alternating superconducting structures and non-superconducting structures arranged in sequence in the third direction;

a first terminal coupled to a first superconducting structure of a first Josephson junction in the sequence of Josephson junctions; and a second terminal coupled to a second superconducting structure of a second Josephson junction in the sequence of Josephson junctions.

2. The superconducting device of claim 1, wherein the superconducting device is used in a current-to-phase transducer.

3. The superconducting device of claim 2, wherein the current-to-phase transducer is used as an inductor.

4. The superconducting device of claim 1, wherein at least one non-superconducting structure is a layer of a non-magnetic material that is one or more atomic layers thick.

5. The superconducting device of claim 1, wherein at least one non-superconducting structure is a layer of a magnetic material that is one or more atomic layers thick.

6. The superconducting device of claim 1, wherein at least one non-superconducting structure has multiple layers of magnetic and non-magnetic materials.

7. The superconducting device of claim 1, wherein at least one non-superconducting structure is made of a superconducting material with defects that prevent superconductivity behavior at low temperatures.

8. The superconducting device of claim 1, wherein at least one non-superconducting structure is made of an insulating material.

9. The superconducting device of claim 1, wherein at least one superconducting structure is made of niobium, aluminum, or lead.

10. The superconducting device of claim 1, wherein at least one non-superconducting structure is made of silver, copper, gold, or aluminum oxide.

11. A non-transitory computer-readable medium comprising stored instructions, which when executed by a processor, cause the processor to generate a digital representation of a structure, the structure comprising:

a wafer surface, wherein the wafer surface is parallel to a first direction and a second direction, and wherein deposition is used to create structures on the wafer surface in a third direction which is directed away from the wafer surface;

a sequence of Josephson junctions coupled in series and arranged in the third direction, wherein the sequence of Josephson junctions comprises alternating superconducting structures and non-superconducting structures arranged in sequence in the third direction;

a first terminal coupled to a first superconducting structure of a first Josephson junction in the sequence of Josephson junctions; and a second terminal coupled to a second superconducting structure of a second Josephson junction in the sequence of Josephson junctions.

12. The non-transitory computer-readable medium of claim 11, wherein the superconducting device is used in a current-to-phase transducer.

13. The non-transitory computer-readable medium of claim 11, wherein at least one non-superconducting structure is a layer of a non-magnetic material that is one or more atomic layers thick.

14. The non-transitory computer-readable medium of claim 11, wherein at least one non-superconducting structure is a layer of a magnetic material that is one or more atomic layers thick.

15. The non-transitory computer-readable medium of claim 11, wherein at least one non-superconducting structure has multiple layers of magnetic and non-magnetic materials.

16. The non-transitory computer-readable medium of claim 11, wherein at least one non-superconducting structure is made of a superconducting material with defects that prevent superconductivity behavior at low temperatures.

17. The non-transitory computer-readable medium of claim 11, wherein at least one non-superconducting structure is made of an insulating material.

18. The non-transitory computer-readable medium of claim 11, wherein at least one superconducting structure is made of niobium, aluminum, or lead.

19. The non-transitory computer-readable medium of claim 11, wherein at least one non-superconducting structure is made of silver, copper, gold, or aluminum oxide.

20. A structure, comprising:

a wafer surface, wherein the wafer surface is parallel to a first direction and a second direction;

a sequence of Josephson junctions coupled in series and arranged in a third direction which is directed away from the wafer surface, wherein the sequence of Josephson junctions comprises alternating superconducting structures and non-superconducting structures arranged in sequence in the third direction, and wherein a first count of superconducting structures in the sequence of Josephson junctions is one greater than a second count of non-superconducting structures in the sequence of Josephson junctions;

a first terminal coupled to a first superconducting structure of a first Josephson junction in the sequence of Josephson junctions; and a second terminal coupled to a second superconducting structure of a second Josephson junction in the sequence of Josephson junctions.

* * * * *